United States Patent
Zhong

(10) Patent No.: US 12,150,269 B2
(45) Date of Patent: Nov. 19, 2024

(54) CHASSIS AND HOLDING SEAT THEREOF

(71) Applicant: Wistron Corporation, New Taipei (TW)

(72) Inventor: Yong-Qing Zhong, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 17/690,055

(22) Filed: Mar. 9, 2022

(65) Prior Publication Data

US 2023/0225072 A1    Jul. 13, 2023

(30) Foreign Application Priority Data

Jan. 10, 2022   (CN) .......................... 202210021305.5

(51) Int. Cl.
H05K 7/14         (2006.01)
(52) U.S. Cl.
CPC ......... H05K 7/1487 (2013.01); H05K 7/1489 (2013.01)
(58) Field of Classification Search
CPC .... H05K 5/023; H05K 7/1489; H05K 7/1487; H05K 5/0221; G06F 1/187
See application file for complete search history.

(56) References Cited

U.S. PATENT DOCUMENTS

| | | | | |
|---|---|---|---|---|
| 7,126,817 B2 * | 10/2006 | Li | ............................ | G06F 1/184 |
| 9,122,458 B2 * | 9/2015 | Yu | ............................ | G06F 1/185 |
| 9,826,658 B1 * | 11/2017 | Mao | ............................ | G06F 1/183 |
| 10,251,300 B1 * | 4/2019 | Mao | ....................... | H05K 7/1487 |
| 10,470,334 B1 * | 11/2019 | Mao | ....................... | H05K 7/1489 |
| 10,474,205 B2 * | 11/2019 | Hung | ....................... | G06F 1/182 |
| 11,197,387 B2 * | 12/2021 | Liu | ........................ | G11B 33/128 |
| 11,310,932 B2 * | 4/2022 | Chang | ....................... | H05K 7/16 |
| 11,490,540 B2 * | 11/2022 | Wu | ........................ | H05K 7/1489 |
| 11,665,848 B2 * | 5/2023 | Wang | .................. | H05K 7/1489 |
| | | | | 312/330.1 |
| 11,703,919 B1 * | 7/2023 | Zhong | .................. | H05K 7/1418 |
| | | | | 361/759 |
| 2021/0385962 A1 * | 12/2021 | Chang | .................... | H05K 5/023 |
| 2022/0418133 A1 * | 12/2022 | Zhong | .................. | H05K 7/1487 |
| 2023/0049413 A1 * | 2/2023 | Tan | ....................... | H05K 7/1489 |

FOREIGN PATENT DOCUMENTS

| | | |
|---|---|---|
| TW | I486951 B | 6/2015 |
| TW | I734520 B | 7/2021 |

OTHER PUBLICATIONS

Examination report dated Sep. 15, 2022, listed in related Taiwan patent application No. 111102720.

* cited by examiner

*Primary Examiner* — Patrick D Hawn
(74) *Attorney, Agent, or Firm* — McClure, Qualey & Rodack, LLP

(57) ABSTRACT

A chassis adapted to receive a holding seat includes a bottom plate and the holding seat. The bottom plate has a chassis rail. The holding seat is adapted to be received in the chassis, and the holding seat includes a first base, a handle, and a connecting rod. The first base has a base rail. The handle is pivotally connected to the first base. A first end of the connecting rod is pivotally connected to the handle, and a second end of the connecting rod is slidably disposed in the base rail and the chassis rail.

11 Claims, 12 Drawing Sheets

CHASSIS AND HOLDING SEAT THEREOF

CROSS-REFERENCE TO RELATED APPLICATION

This non-provisional application claims priority under 35 U.S.C. § 119(a) to Patent Application No. 202210021305.5 filed in China on Jan. 10, 2022, and the entire contents of which are hereby incorporated by reference.

BACKGROUND

Technical Field

The instant disclosure relates to a chassis and a holding seat thereof, particularly a holding seat that is easy to assemble and disassemble, and a chassis having the holding seat.

Related Art

Currently, a plurality of holding seats for receiving various electronic elements are usually arranged in the chassis of the server. The electronic elements need to be connected to the motherboard through the connectors to transmit signals. Under different application scenarios, these holding seats may also be applied to various and wide application environments, so as to solve corresponding problems. Hence, how to assemble and disassemble the holding seat to the chassis without tools and with reduced efforts is a major subject of current research.

SUMMARY

Accordingly, according to some embodiments, a chassis comprising a bottom plate and a holding seat is provided. The bottom plate has a chassis rail. The holding seat is adapted to be received in the chassis, and the holding seat comprises a first base, a handle, and a connecting rod. The first base has a base rail. The handle is pivotally connected to the first base. The connecting rod has a first end and a second end. The first end is pivotally connected to the handle, and the second end is slidably disposed in the base rail and the chassis rail.

According to some embodiments, the chassis rail has a first length, the base rail has a second length, and the first length is less than the second length.

According to some embodiments, the second end of the connecting rod has a first convex part and a second convex part. The first convex part is slidably disposed in the base rail, and the second convex part is slidably disposed in the chassis rail.

According to some embodiments, the chassis further comprises a chassis positioning portion on the bottom plate. The first base further comprises a base positioning portion corresponding to the chassis positioning portion, so that the chassis positioning portion is slidably disposed on the base positioning portion.

According to some embodiments, the holding seat further comprises a second base, and the second base is connected to the first base.

According to some embodiments, the second base further comprises an extension part, and the first base further comprises a base fixing part. The extension part extends from the second base toward the first base, and the extension part corresponds to the base fixing part to detachably receive the extension part in the base fixing part.

According to some embodiments, the first base further comprises an elastic element between the extension part and the first base.

According to some embodiments, the second base further comprises a guiding part. The guiding part is connected to the extension part, and the guiding part is adjacent to an end of the first base, so that the first convex part is detachably abutted against the extension part along the guiding part.

As above, in some embodiments, an electronic element is received in the holding seat, and the connecting rod of the holding seat is slidably disposed to the holding seat (through the base rail) and the chassis (through the chassis rail thereof). The length of the chassis rail is less than the length of the base rail. Therefore, if the handle of the holding seat is pivotally rotated to drive the connecting rod to move toward a direction, and the connecting rod is abutted against an end of the chassis rail having a shorter rail length without stopping pivotally rotating the handle, the holding seat (and the electronic element received in the holding seat) would move in a direction opposite to the above direction. Hence, the holding seat (and the electronic element received in the holding seat) can be moved on the chassis more easily, and thus the electronic element can be assembled to or connected to other corresponding element on the chassis more conveniently. Moreover, in some embodiments, the moving distance of the holding seat (and the electronic element received in the holding seat) on the chassis may be adjusted by adjusting the length of the chassis rail and the length of the base rail. For example, the moving distance may be simply the difference between the length of the chassis rail and the length of the base rail. Accordingly, the holding seat (and the electronic element received in the holding seat) may be thus moved by the moving distance to the desired position more easily.

The detailed features and advantages of the present disclosure are described in detail in the following embodiments, and the content is sufficient to enable any person who is familiar with the relevant art to understand the technical contents of the present disclosure and implement them accordingly. Based on the disclosed contents of the specification, claim(s) and drawing(s), any person who is familiar with the relevant art can easily understand the purposes and advantages related to the embodiments of the present disclosure.

DETAILED DESCRIPTION

The following description is supplemented with the drawings to illustrate the embodiments of the present disclosure more clearly.

Figure 1A:
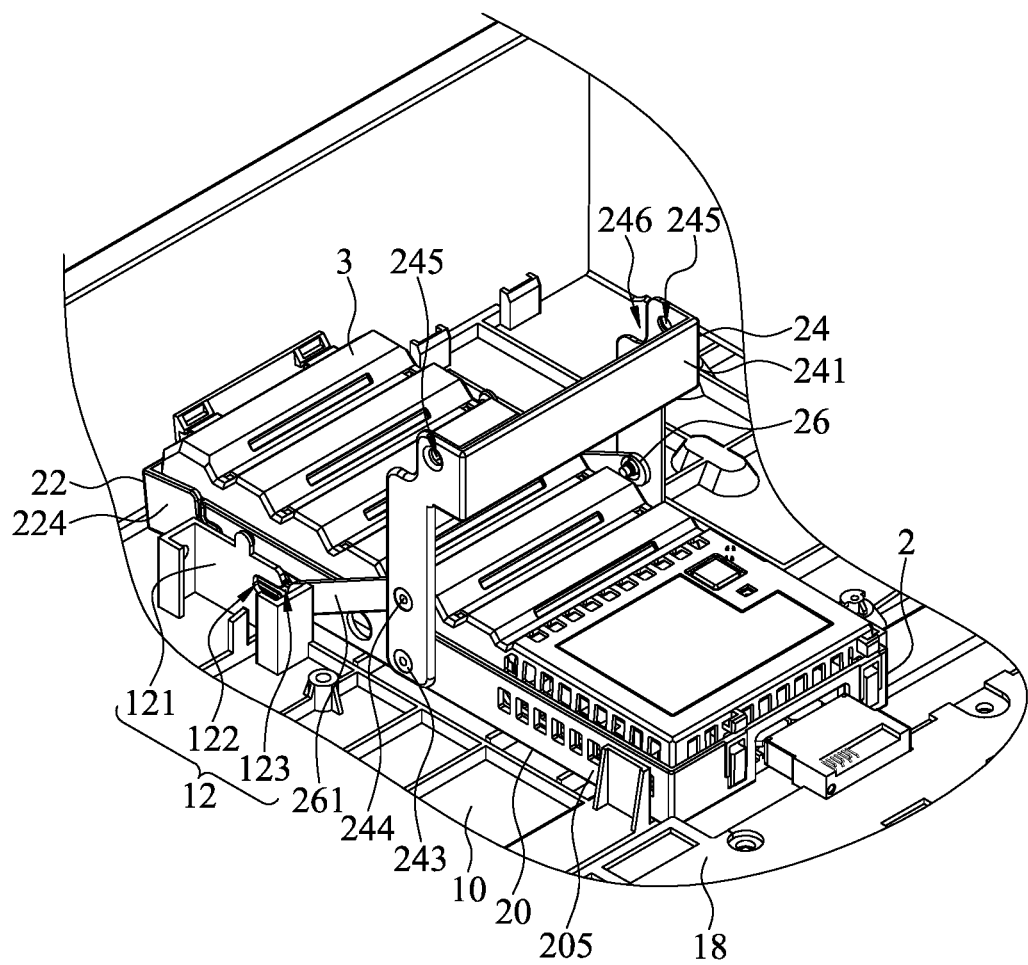
FIG. 1A illustrates an assembled perspective view of a chassis and a holding seat thereof according to some embodiments.
Figure 1B:
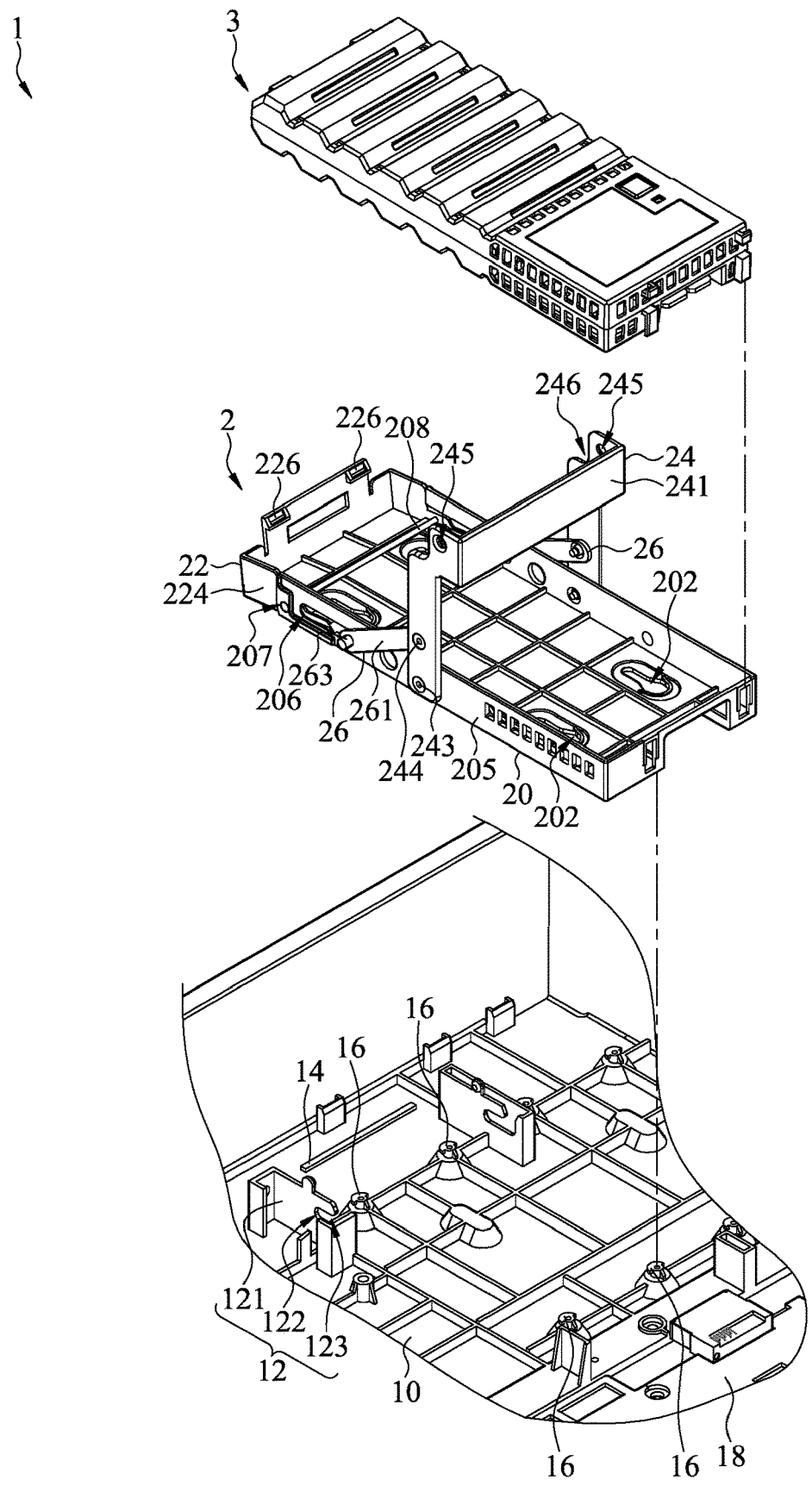
FIG. 1B illustrates an exploded view of the chassis and the holding seat thereof according to some embodiments shown in FIG. 1A.
Figure 5A:
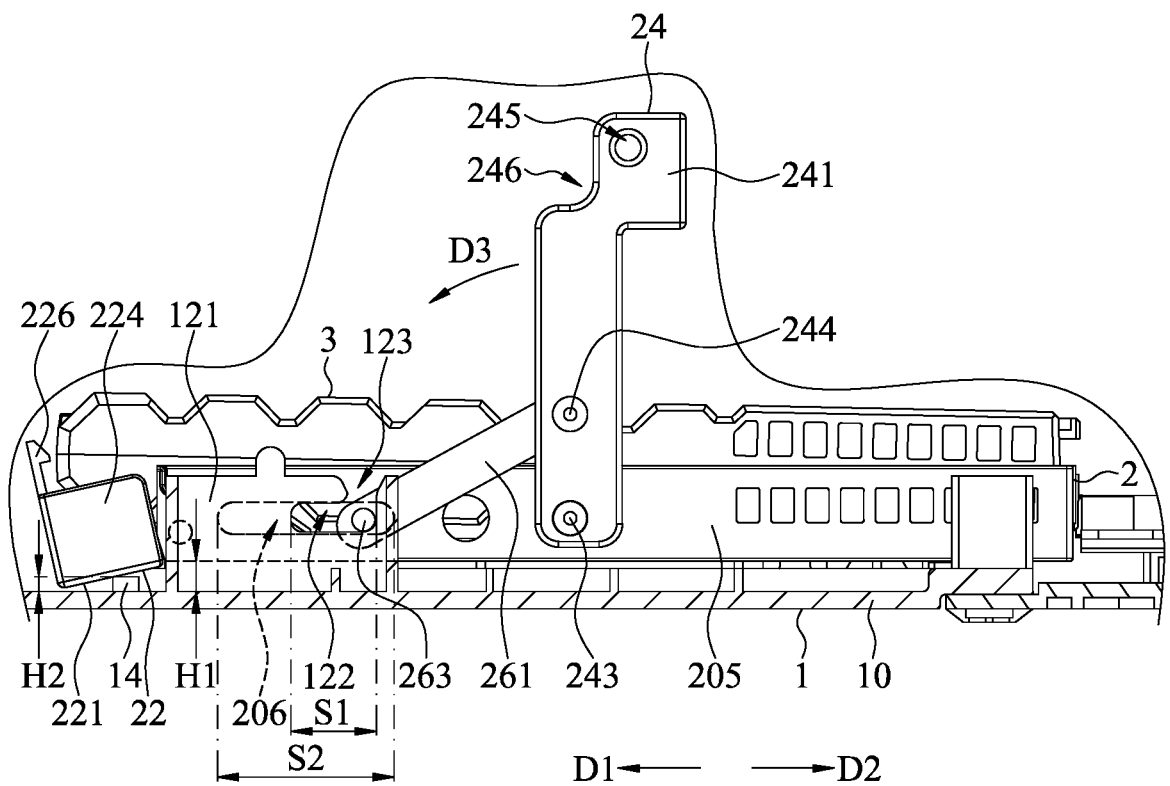
FIG. 5A illustrates a cross-sectional view of the chassis and the holding seat thereof according to some embodiments shown in FIG. 3A.

Please refer to FIG. 1A, FIG. 1B, and FIG. 5A. FIG. 1A illustrates an assembled perspective view of a chassis 1 and a holding seat 2 thereof according to some embodiments. FIG. 1B illustrates an exploded view of the chassis 1 and the holding seat 2 thereof according to some embodiments shown in FIG. 1A. FIG. 5A illustrates a cross-sectional view of the chassis 1 and the holding seat 2 thereof according to some embodiments shown in FIG. 3A. In FIG. 1A and FIG. 1B, a chassis 1 comprises a bottom plate 10, and the chassis 1 is adapted to receive a board 18 and a holding seat 2. The holding seat 2 is adapted to receive one or more electronic elements 3. The electronic element 3 may be connected to the board 18 through a connector (not numbered) to transmit electronic signals. For example, the electronic element 3 may be a battery module, a power supply module, an integrated circuit element, or the like.

The holding seat 2 comprises a first base 20, a handle 24, and a connecting rod 26. The handle 24 is rotatably connected to the first base 20. The first end (not numbered) of the connecting rod 26 is movably connected to the first base 20, and the second end (not numbered; that is, the end opposite to the first end) of the connecting rod 26 is connected to the handle 24. Therefore, the connecting rod 26 is driven by the handle 24 to move on the first base 20.

In some embodiments, the bottom plate 10 has a chassis rail 122, and the chassis rail 122 has a first length S1; that is, in this embodiment, the length of the chassis rail 122 is the first length S1 (as shown in FIG. 5A). The first base 20 of the holding seat 2 has a base rail 206, and the base rail 206 has a second length S2; that is, in this embodiment, the length of the base rail 206 is the second length S2 (as shown in FIG. 5A). The length of the chassis rail 122 is less than the length of base rail 206 (that is, the first length S1 is less than the second length S2, as shown in FIG. 5A). The second end of the connecting rod 26 is slidably disposed in the base rail 206 and the chassis rail 122. When the handle 24 is rotated along a third direction D3 (as shown in FIG. 5A, in this embodiment, the third direction D3 is the counterclockwise direction), the connecting rod 26 is driven by the handle 24 to move the second end of the connecting rod 26 in the base rail 206 and the chassis rail 122 (that is, in this embodiment, as shown in FIG. 5A, the second end of the connecting rod 26 is driven to move along a first direction D1, from the right side to the left side of the base rail 206). During the movement of the connecting rod 26, when the second end of the connecting rod 26 is abutted against an end of the chassis rail 122 away from the handle 24 and the handle 24 is kept rotating along the third direction D3, the second end of the connecting rod 26 is moved toward the left side of the base rail 206 along the first direction D1. Since the first length S1 of the chassis rail 122 is less than the second length of the base rail 206, the holding seat 2 is thus moved along a second direction D2 (opposite to the first direction DD. That is, in this embodiment, the holding seat 2 is moved toward the right side along the second direction D2, as shown in FIG. 5A). Therefore, by simply rotating the handle 24 with respect to the holding seat 2, the holding seat 2 can be moved on the chassis 1 by a specific moving distance and the electronic element 3 on the holding seat 2 can be connected to the connector of the chassis 1 so as to transmit the electronic signals to the board 18. Hence, the electronic element can be assembled to the board 18 quickly and with reduced efforts. Moreover, in some embodiments, the available space in the chassis 1 for assembling is limited and thus not suitable for applying an external force in the chassis 1 along a certain direction (for example, the first direction D1 or the second direction D2 in FIG. 5A). However, by rotating the handle 24 of the holding seat 2 along a direction having a relatively larger space (such as the third direction D3 in FIG. 5A) in the chassis 1, the electronic element 3 can still be assembled to the connector more quickly and with reduced effects in the limited assembling space of the chassis 1. Therefore, the electronic element 3 can be assembled in the chassis 1 without providing additional assembling space in the chassis 1.

Figure 2A:
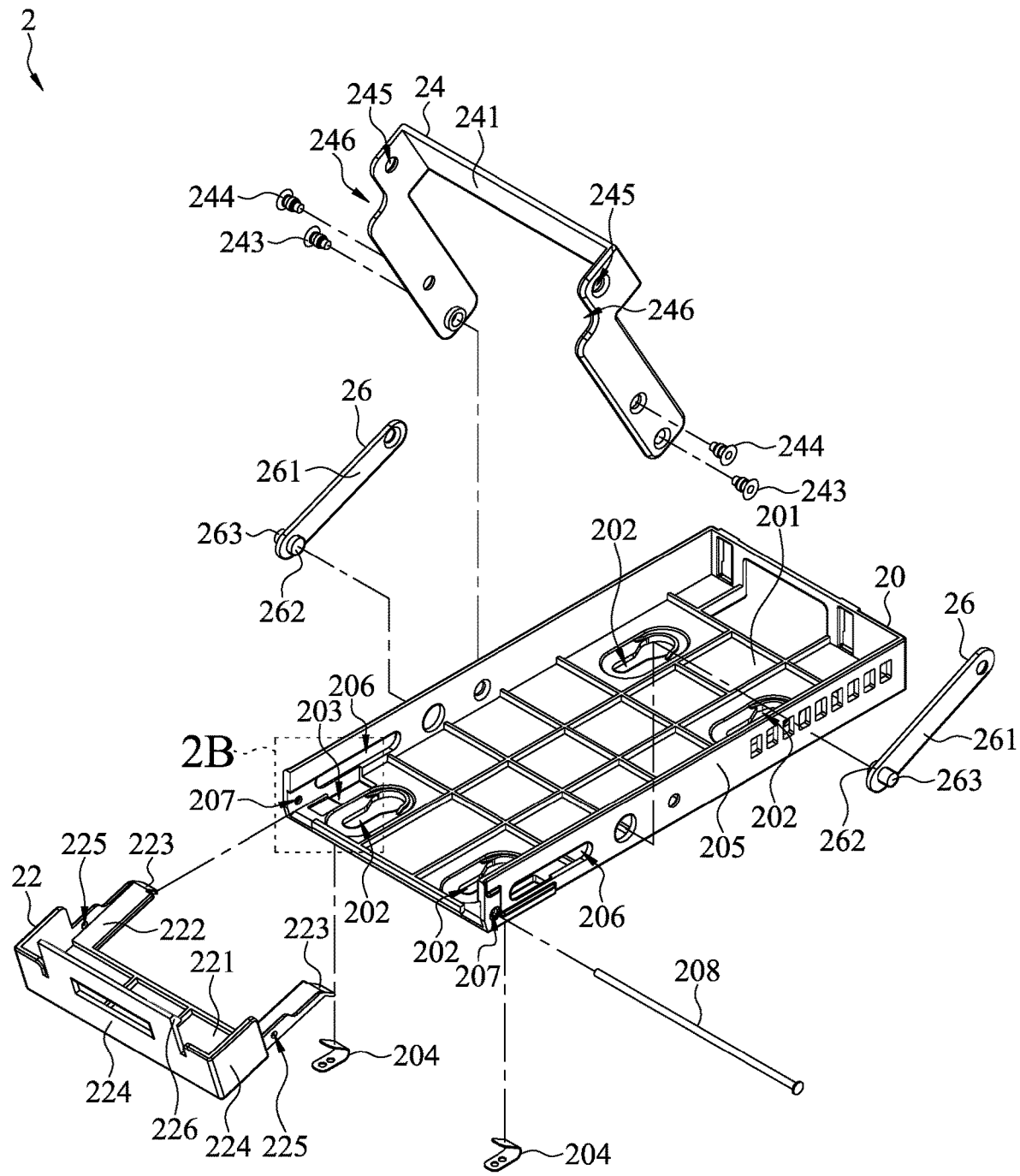
FIG. 2A illustrates an exploded view of a holding seat according to some embodiments.
Figure 2B:
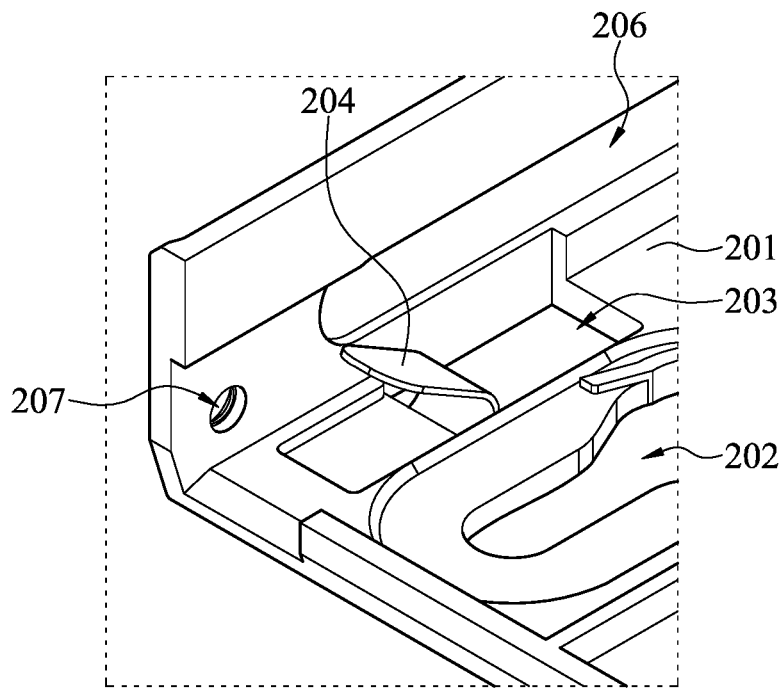
FIG. 2B illustrates an enlarged partial perspective view of the holding seat according to some embodiments shown in FIG. 2A.
Figure 2C:
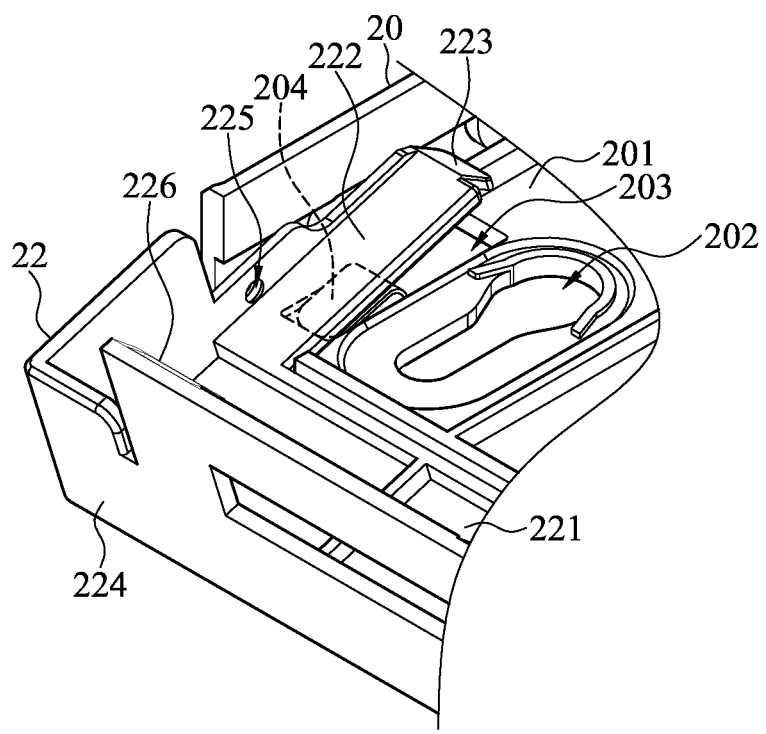
FIG. 2C illustrates an enlarged partial perspective view of the holding seat according to some embodiments shown in FIG. 2A.
Figure 2D:
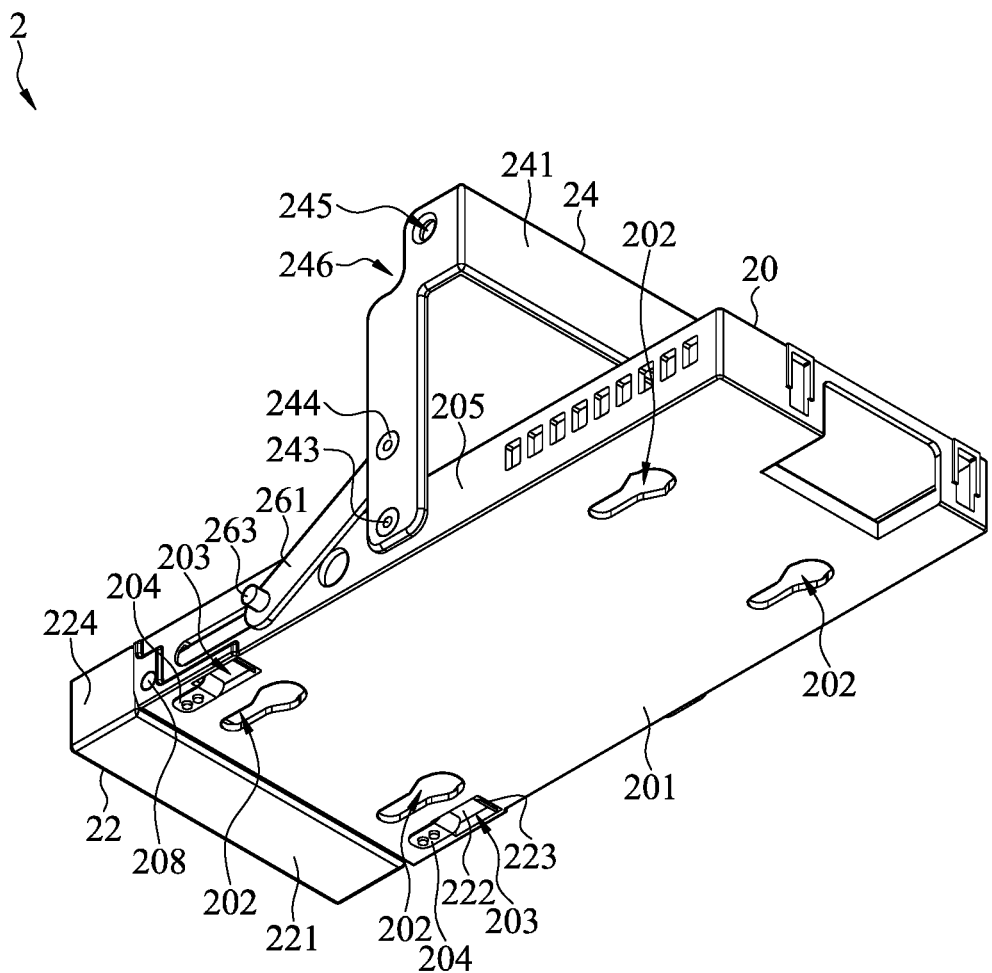
FIG. 2D illustrates a bottom perspective view of the holding seat according to some embodiments shown in FIG. 2A.

Various embodiments of the holding seat 2 are described as below. Please refer to FIG. 2A to FIG. 2D and FIG. 5A. FIG. 2A illustrates an exploded view of a holding seat 2 according to some embodiments. FIG. 2B and FIG. 2C illustrate enlarged partial perspective views of the holding seat 2 according to some embodiments shown in FIG. 2A, respectively. FIG. 2D illustrates a bottom perspective view of the holding seat 2 according to some embodiments shown in FIG. 2A. In some embodiments, the first base 20 has a first bottom plate 201 and a first side plate 205. In some embodiments, the first base 20 may have two first side plates 205, and the two first side plates 205 are respectively connected to two sides of the first bottom plate 201 to form a semi-opened receiving space, so that the electronic element 3 is detachably received in the receiving space. In some embodiments, the first side plate 205 may have one or more base rails 206. The base rail 206 is substantially parallel to the first bottom plate 201 and extends along the direction of the first bottom plate 201 (that is, the first direction D1 as shown in FIG. 5A). For example, in FIG. 2A, the base rail 206 may be a long, oval, and hollow rail, and the length of the base rail 206 is the second length S2.

In FIG. 2A, according to some embodiments, the handle 24 has a handle body 241, and the handle body 241 comprises two arm parts (not numbered) and an operation part (not numbered). The two arm parts are respectively connected to two ends of the operation part, and the two arm parts are respectively connected to the two first side plates 205 of the first base 20. Therefore, the handle 24 is driven to rotate with respect to the first base 20 simply by applying an external force on the operation part of the handle body 241. More specifically, in this embodiment, the arm parts of the handle 24 are pivotally connected to the first side plate 205 of the first base 20 through the first fixing parts 243. The arm part of the handle 24 may be angularly arranged with respect to the first side plate 205 of the first base 20. In some embodiments, when the handle 24 is rotated with respect to the first base 20, an angle between the arm part of the handle 24 and the first side plate 205 of the first base 20 may be changed (for example, between 0° and 90°). In some embodiments, the first fixing part 243 comprises a first concave part (not numbered) and a first shaft part (not numbered), and the first shaft part matches with the first concave part. For example, in FIG. 2A, the first concave part is a through hole on the handle body 241 (for example, on the arm part of the handle body 241), and the first shaft part is a pivot screw correspondingly passing through the first concave part, so that the handle 24 can be rotated with respect to the first base 20.

In some embodiments, the connecting rod 26 may comprise one or more connection bodies 261, so that the handle 24 and the first base 20 can be connected with each other through the connection body 261. In FIG. 2A, the connecting rod 26 has a connection body 261. The first end of the connection body 261 is pivotally connected to the handle 24 (for example, the arm part of the handle body 241), and the second end of the connection body 261 is slidably disposed in the base rail 206. Therefore, when the handle 24 is rotated with respect to the holding seat 2, the connecting rod 26 is driven by the handle 24 to move along the direction of the base rail 206 (for example, the first direction D1 or the second direction D2 shown in FIG. 5A). In some embodiments, the connecting rod 26 comprises a plurality of connection bodies (not shown). Moreover, in these embodiments, one end of any of the connection bodies is slidably disposed in the base rail 206, one end of another one of the connection bodies is pivotally connected to the handle 24, and the connection bodies are connected with each other to be folded and received between the handle 24 and the first base 20. Therefore, by the arrangement of the connection bodies having the same or different lengths, the total length of the connecting rod 26 can be thus extended and the angle between the handle 24 and the first base 20 can be increased. For example, the angle between the arm part of the handle 24 and the first base 20 can be increased from 90° to 135°. Hence, during assembling the electronic element 3 in the holding seat 2, the handle 24 can be prevented from staying at a middle portion of the holding seat 2 to interfere with the electronic element 3. Therefore, the electronic element 3 can be assembled in the holding seat 2 easily and conveniently.

In FIG. 2A, the first end of the connection body 261 is pivotally connected to the handle body 241 through the second fixing part 244. In some embodiments, the second fixing part 244 comprises a second concave part (not numbered) and a second shaft part (not numbered), and the second shaft part matches with the second concave part. For example, in FIG. 2A, the second concave part comprises two through holes respectively at the handle body 241 and the first end of the connection body 261. The second shaft part is a pivot screw correspondingly passing through the second concave part, so that the first end of the connection body 261 can be rotated with respect to the handle body 241.

In FIG. 2A, the second end of the connection body 261 is slidably disposed in the base rail 206 through a first convex part 262. In some embodiments, the first convex part 262 is at the second end of the connection body 261, and the first convex part 262 is a convex structure that faces the first side plate 205 and matches with the base rail 206. For example, the first convex part 262 is a cylindrical convex structure, and the size of the first convex part 262 (for example, the diameter of the cylinder) is less than or equal to the size of the base rail 206. Therefore, the first convex part 262 is slidably disposed in the base rail 206 without being interfered by the base rail 206 due to the size confliction between the first convex part 262 and the base rail 206. Accordingly, when the handle 24 is rotated from 90° to 0°, the first convex part 262 of the connecting rod 26 is moved in the base rail 206 along the direction of the base rail 206 (for example, along the first direction D1 or the second direction D2 shown in FIG. 5A), and the first convex part 262 is moved from an end adjacent to the handle 24 toward the other end away from the handle 24 (the leftmost side of the base rail 206 shown in FIG. 5A). Hence, the holding seat 2 can be covered by the handle 24.

From the above-mentioned embodiments, by the arrangement of the first base 20, the handle 24, and the connecting rod 26, the holding seat 2 having a receiving space that is capable of receiving the electronic element 3 can be provided.

In some embodiments, the holding seat 2 further comprises a second base 22, and the second base 22 is movably connected to the first base 20. In FIG. 2A, the second base 22 has a second bottom plate 221 and a second side plate 224. In some embodiments, the second base 22 may have two second side plates 224, the two second side plates 224 are respectively connected to two sides of the second bottom plate 221, and the second base 22 is connected to the first base 20 to form a semi-opened receiving space, so as to detachably receive the electronic element 3 in the receiving space.

In some embodiments, the first base 20 is connected to the second base 22. For example, in FIG. 2A, the first base 20 has a first shaft hole 207 and a base shaft element 208. The first shaft hole 207 is on the first side plate 205 and matches with the base shaft element 208. The base shaft element 208 comprises one or more base shaft parts (not numbered). The base shaft part may be one or more short cylindrical shafts that can be disposed just at one of the two first side plates 205 or respectively disposed at the two first side plates 205. Alternatively, in some embodiments, the base shaft part may be a long cylindrical shaft that is capable of being disposed at the two first side plates 205 at the same time. The second side plate 224 of the second base 22 has a second shaft hole 225, and the second shaft hole 225 corresponds to the first shaft hole 207. The base shaft element 208 passes through the first shaft hole 207 and the second shaft hole 225 at the same time. Therefore, the first base 20 and the second base 22 can be movably connected with each other through the base shaft element 208.

In some embodiments, the second base 22 further has a buckling part 226. In FIG. 2A, according to some embodiments, the buckling part 226 protrudes from the second side plate 224. The buckling part 226 is at a side of the second base 22 away from the first base 20, and the buckling part 226 protrudes toward a direction away from the second bottom plate 221. The buckling part 226 may thus be buckled and/or fixed to the electronic element 3, thereby preventing the electronic element 3 from detaching off owing to impacts by external forces.

In some embodiments, the second base 22 further comprises an extension part 222, and the first base 20 comprises a base fixing part 203. In FIG. 2A, according to some embodiments, the extension part 222 is a long and flat bottom plate which extends in a direction from the second base 22 toward the first base 20, and the extension part 222 corresponds to the base fixing part 203. The base fixing part 203 is disposed on the first bottom plate 201, the extension part 222 and the base fixing part 203 are disposed at a side of the first base 20 adjacent to the first side plate 205, so that the extension part 222 contacts the first convex part 262 of the connecting rod 26. The base fixing part 203 may be a recessed part, and the recessed part may be a slot (a thin and narrow groove), a concave aperture (with a smaller diameter), a concave hole (with a larger diameter) or combinations thereof, and the recessed part may be defined through the first bottom plate 201 or not. Therefore, the extension part 222 is detachably received in the base fixing part 203.

Figure 3A:
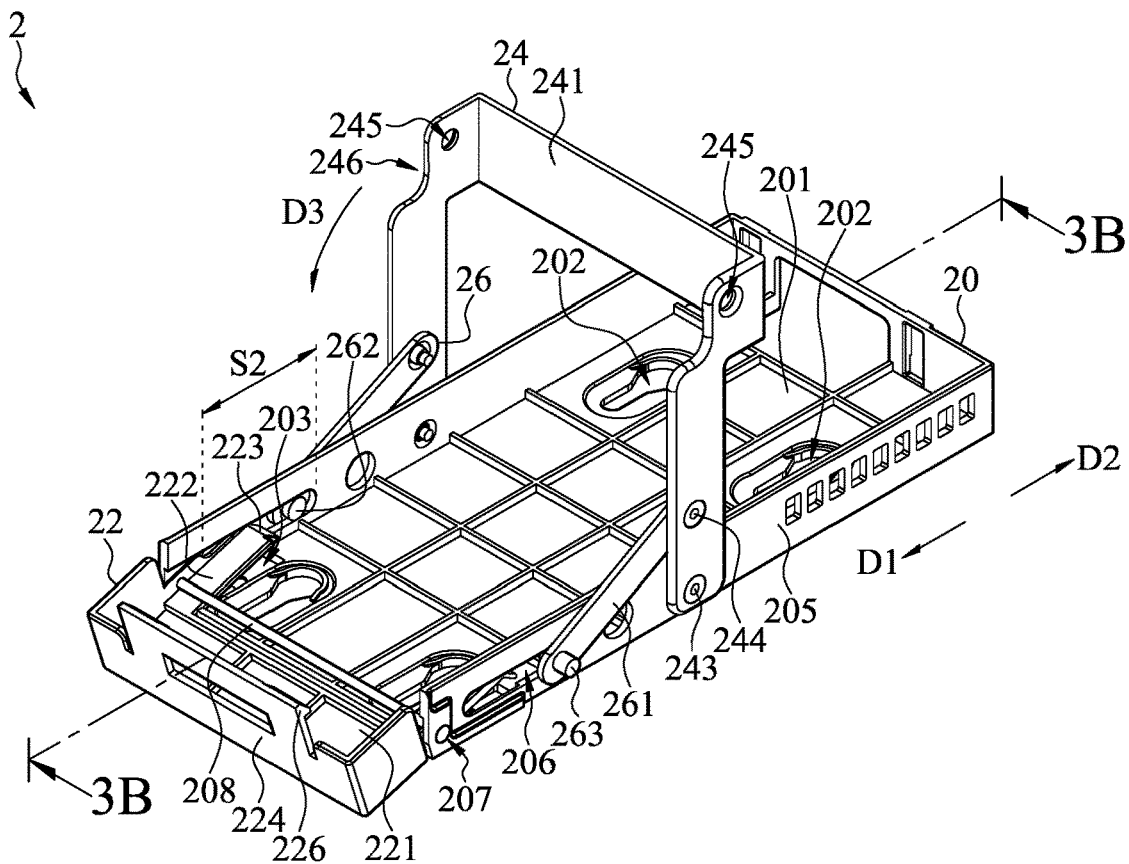
FIG. 3A illustrates a schematic perspective view showing the operation of a holding seat according to some embodiments.
Figure 3B:
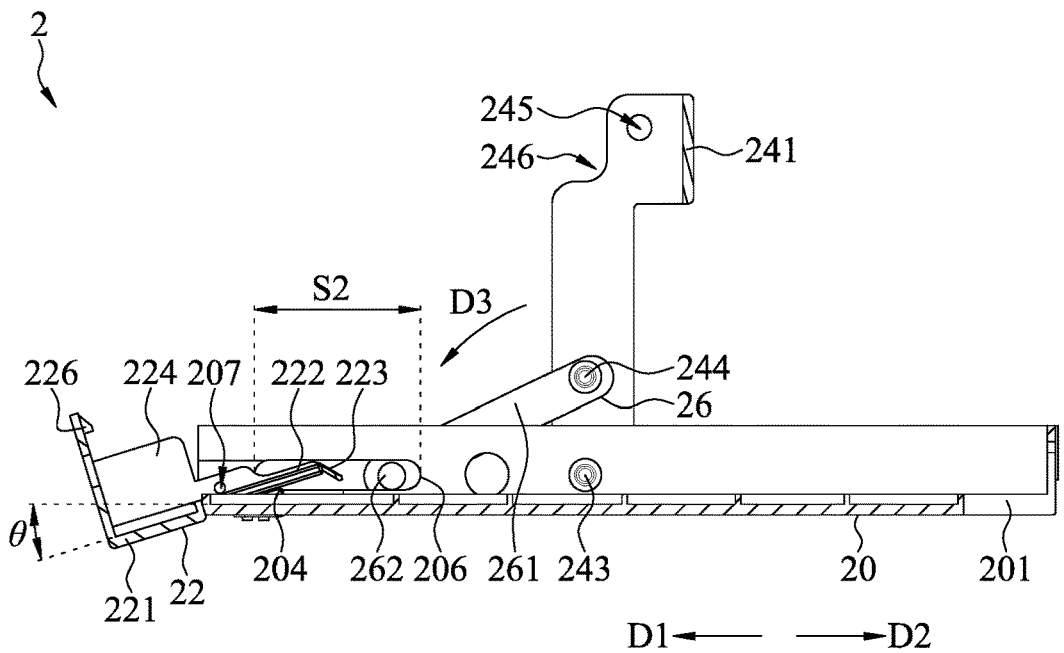
FIG. 3B illustrates a cross-sectional view of the holding seat according to some embodiments shown in FIG. 3A.

For example, please refer to FIG. 3A and FIG. 3B at the same time. FIG. 3A illustrates a schematic perspective view showing the operation of a holding seat 2 according to some embodiments, and FIG. 3B illustrates a cross-sectional view of the holding seat 2 according to some embodiments shown in FIG. 3A. When the handle 24 is not rotated, the angle between the handle 24 and the first base 20 is, for example, 90°. Under this condition, the second base 22 may naturally fall down due to the gravity, so that the second base 33 is rotated with respect to the first base 20 along the third direction D3 (that is, the counterclockwise direction), and an angular relationship (numbered as the falling angle θ) exists between the second base 22 and the first base 20. More specifically, in this embodiment, the extension part 222 is driven by the second base 22 to rotate with respect to the first base 20 along the third direction D3 and thus the extension part 222 is moved out from the base fixing part 203. When the second base 22 is applied with an external force to rotate with respect to the first base 20 along a direction opposite to the third direction D3 (that is, the clockwise direction), the extension part 222 is driven to rotate along the same direction that is opposite to the third direction D3 (that is, the clockwise direction) so as to be received in the base fixing part 203.

In some embodiments, the second base 22 further comprises a guiding part 223, and the guiding part 223 is connected to the extension part 222. In FIG. 2A, according to some embodiments, the guiding part 223 is at an end of the extension part 222 adjacent to the first base 20 (that is, the guiding part 223 is adjacent to an end of the first base 20). In FIG. 3B, according to some embodiments, an angular relationship exists between the guiding part 223 and the extension part 222. The guiding part 223 and the extension part 222 are respectively planes that are connected to each other. More specifically, in this embodiment, the guiding part 223 is inclined from the extension part 222 toward the first bottom plate 201.

Figure 3C:
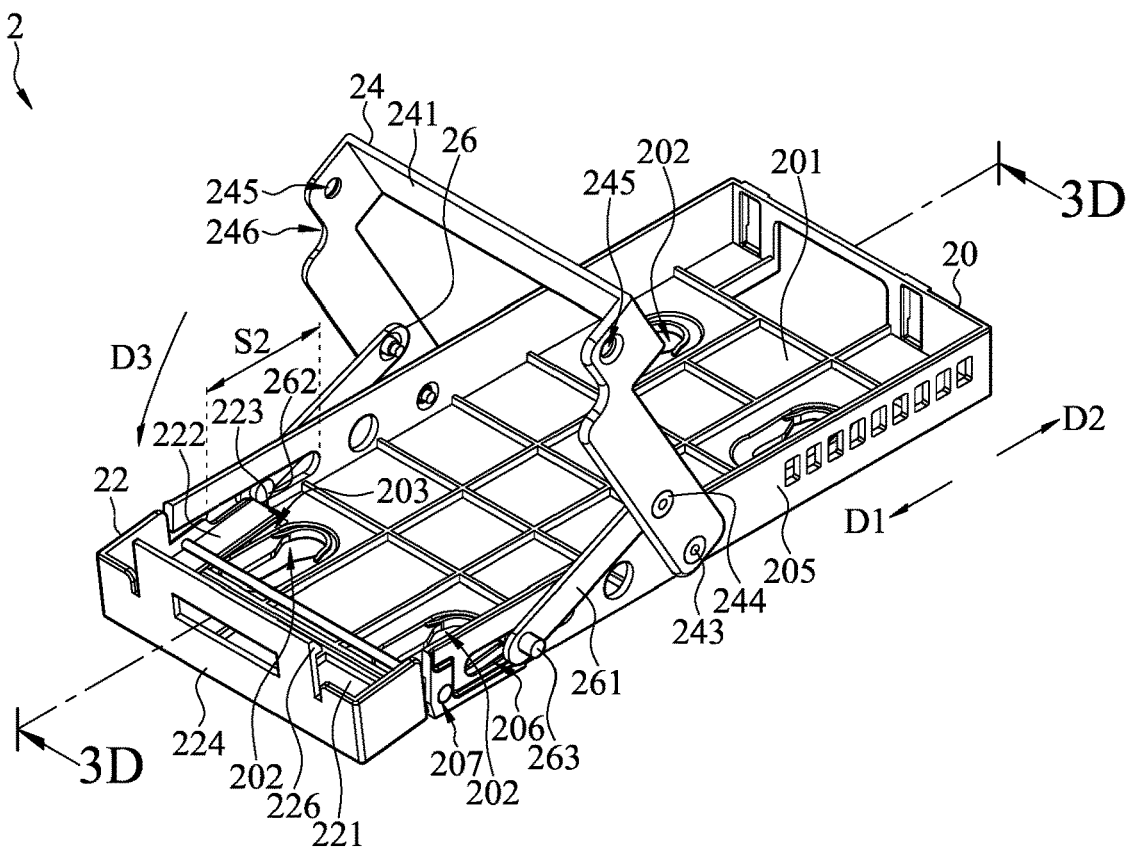
FIG. 3C illustrates a schematic perspective view showing the operation of a holding seat according to some embodiments.
Figure 3D:
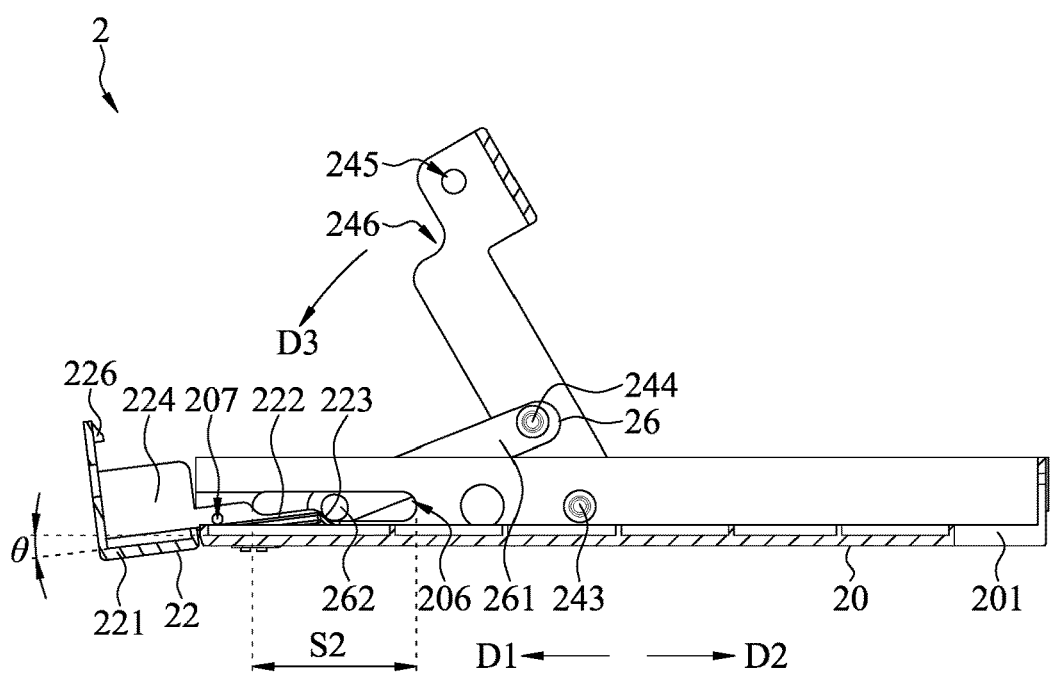
FIG. 3D illustrates a cross-sectional view of the holding seat according to some embodiments shown in FIG. 3C.
Figure 3E:
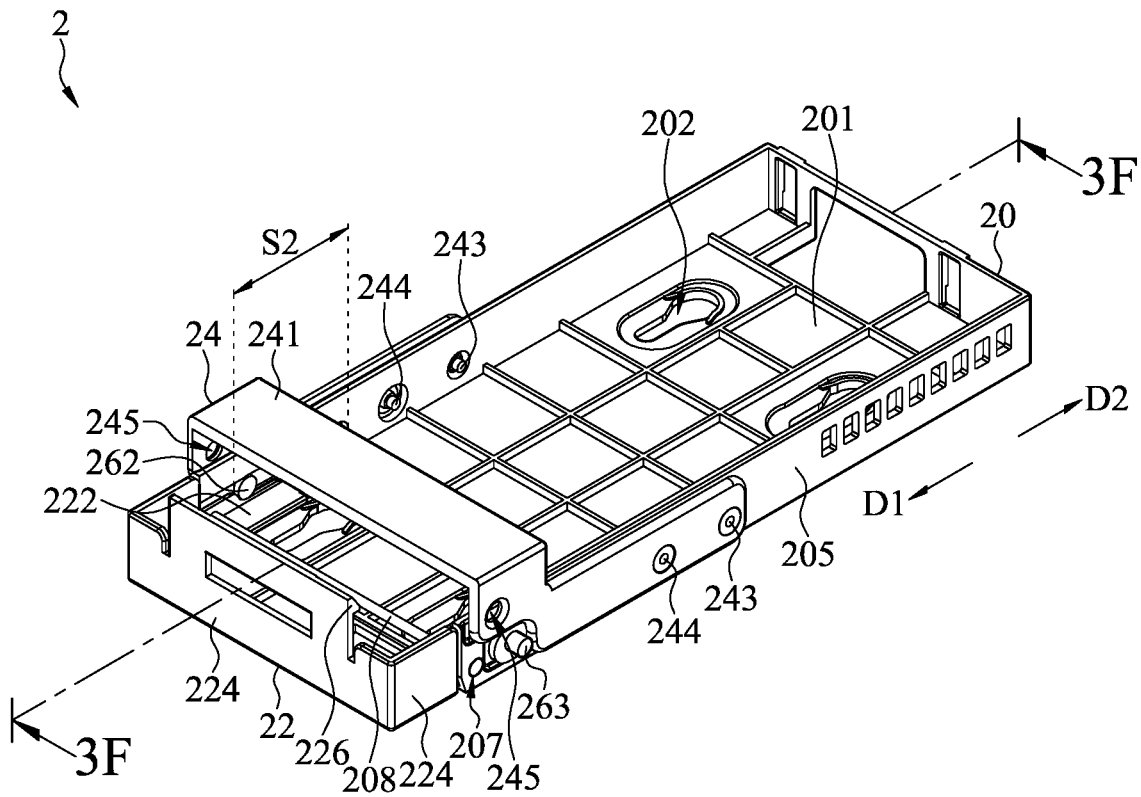
FIG. 3E illustrates a schematic perspective view showing the operation of a holding seat according to some embodiments.
Figure 3F:
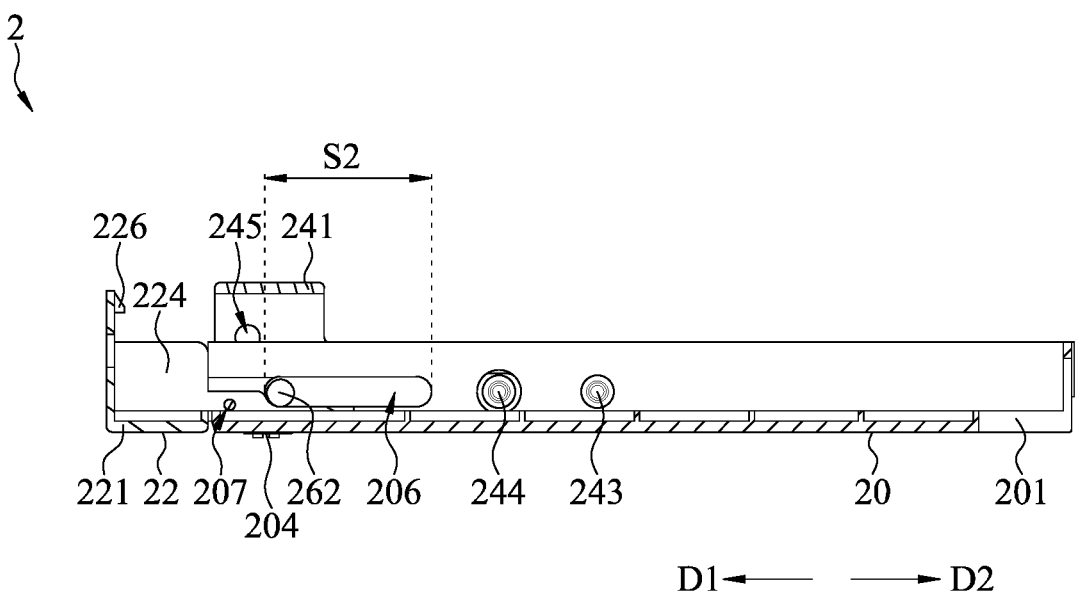
FIG. 3F illustrates a cross-sectional view of the holding seat according to some embodiments shown in FIG. 3E.

Please refer to FIG. 3C to FIG. 3F at the same time. FIG. 3C illustrates a schematic perspective view showing the operation of a holding seat 2 according to some embodiments. FIG. 3D illustrates a cross-sectional view of the holding seat 2 according to some embodiments shown in FIG. 3C. FIG. 3E illustrates a schematic perspective view showing the operation of a holding seat 2 according to some embodiments. FIG. 3F illustrates a cross-sectional view of the holding seat 2 according to some embodiments shown in FIG. 3E. In FIG. 3C and FIG. 3D, during rotating the handle 24 along the third direction D3 to make an angle between the handle 24 and the first base 20 decreased, for example, from 90° to 0°, the handle 24 drives the first convex part 262 of the connecting rod 26 to slide along a direction toward the second base 22 (that is, the first direction D1). More specifically, in this embodiment, the first convex part 262 is driven to contact the guiding part 223 and move along the plane of the guiding part 223. When the first convex part 262 is kept moving toward the extension part 222 along the guiding part 223 to slide on the extension part 222, the second base 22 is driven to rotate along the direction opposite to the third direction D3 (that is, the clockwise direction), and the falling angle θ between the first base 20 and the second base 22 is further decreased continuously. In FIG. 3E and FIG. 3F, during rotating the handle 24 along the third direction D3 to make the angle between the handle 24 and the first base 20 decreased to, for example, 5° or less, the handle 24 drives the first convex part 262 to be abutted against an end of the base rail 206 away from the handle 24 (that is, the end of the base rail 206 is adjacent to the second base 22). More specifically, in this embodiment, the first convex part 262 is abutted against the extension part 222 of the second base 22 and thus the second base 22 is driven by the first convex part 262 to rotate to a vertical plane having a height being substantially equal to the height of the first base 20 (that is, the falling angle θ shown in FIG. 3B or FIG. 3D approaches 0°). Under this arrangement, the extension part 222 is received in the base fixing part 203.

In contrast, please refer again to FIG. 3C and FIG. 3D. During rotating the handle 24 along the direction opposite to the third direction D3 to make the angle between the handle 24 and the first base 20 increased, for example, from to 5° (or less) to 90°, the first convex part 262 is driven to slide along a direction away from the second base 22 (that is, the second direction D2). The first convex part 262 is driven to move from the extension part 222 to pass through the guiding part 223 and is moved away from the guiding part 223, and the first convex part 262 is then driven to move toward the end of the base rail 206 adjacent to the handle 24, so that the falling angle θ between the second base 22 and the first base 20 is correspondingly recovered to the falling angle θ shown in FIG. 3D (or even to the falling angle θ shown in FIG. 3B). Under this arrangement, the extension part 222 is away from the base fixing part 203.

In some embodiments, the first base 20 further comprises an elastic element 204. The elastic element 204 is an element with a coefficient of elasticity that generates a restoring force when applied with external forces, and the elastic element 204 may be an elastic piece or a spring. In FIG. 2B, according to some embodiments, the elastic element 204 is an elastic piece, and two ends of the elastic element 204 are respectively disposed at the two sides of the first bottom plate 201. One of two ends of the elastic element 204 is fixed to the bottom side of the first bottom plate 201, and the other end of the elastic element 204 is a free end and is adjacent to the first side plate 205. In some embodiments, the elastic element 204 is disposed at the base fixing part 203. In FIG. 2C, according to some embodiments, the free end of the elastic element 204 is disposed between the extension part 222 and the first base 20. Please refer to FIG. 2C and FIG. 3B at the same time, when the first convex part 262 of the connecting rod 26 is abutted against the extension part 222 and/or the guiding part 223, the extension part 222 and the guiding part 223 are abutted against the elastic element 204 to further compress the elastic element 204 toward the first bottom plate 201 to restore the elastic potential energy in the elastic element 204. On the other hand, when the first convex part 262 is gradually moved away from the extension part 222 and the guiding part 223 along the second direction D2, the pressure on the extension part 222 caused by the first convex part 262 is gradually decreased. Under this arrangement, the elastic potential energy of the elastic element 204 is gradually released to further push against the extension part 222 along the third direction D3 (that is, the counterclockwise direction), so that the falling angle θ between the second base 22 and the first base 20 is quickly recovered to the falling angle θ shown in FIG. 3D (or even to the falling angle θ shown in FIG. 3B). Therefore, the second base 22 can be quickly recovered to its original position simply by rotating the handle 24 along a direction opposite to the third direction D3 (that is, the clockwise direction). Meanwhile, the electronic element 3 received in the holding seat 2 is thus lifted up by the extension part 222 and the elastic element 204, which is helpful in disassembling the electronic element 3 from the receiving space of the holding seat 2.

Figure 4:
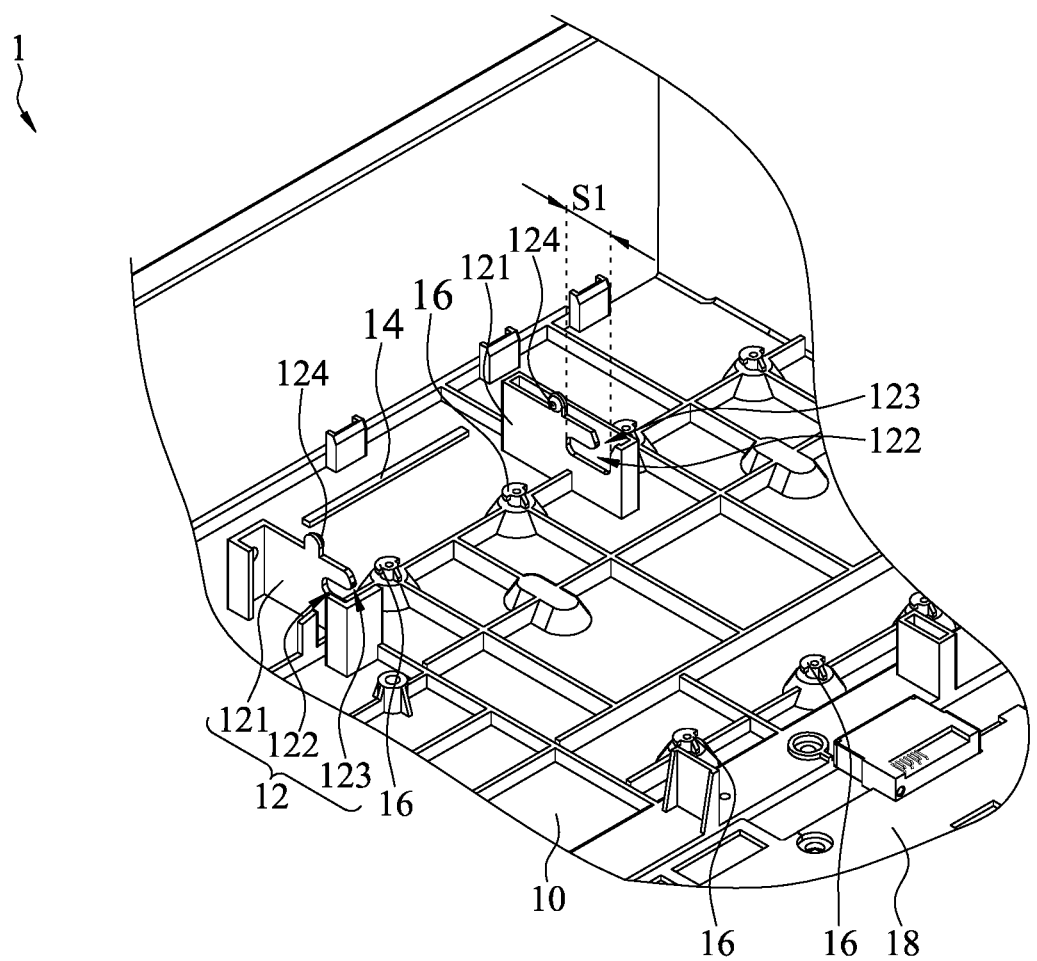
FIG. 4 illustrates a perspective view of a chassis according to some embodiments.

Various embodiments of the chassis 1 are described as below. Please refer to FIG. 4. FIG. 4 illustrates a perspective view of a chassis 1 according to some embodiments. In FIG. 4, according to some embodiments, the chassis 1 comprises a bottom plate 10 and an assembling portion 12, and the assembling portion 12 is disposed on the bottom plate 10. In some embodiments, the assembling portion 12 comprises an assembling body 121, and the assembling body 121 is connected to the bottom plate 10. In some embodiments, the chassis rail 122 is disposed on the assembling body 121. The chassis rail 122 is a rail substantially parallel to the bottom plate 10 and extending along the direction of the bottom plate 10 (for example, the first direction D1 shown in FIG. 5A). In some embodiments, the assembling body 121 may have one or more guiding openings 123, and each of the guiding openings 123 corresponds to a corresponding one of the chassis rails 122. Therefore, the guiding opening 123 and the chassis rail 122 is combined to form an opened rail, so that the holding seat 2 can be assembled to the chassis 1 through the guiding opening(s) 123 conveniently.

In FIG. 5A, according to some embodiments, the second end of the connection body 261 is slidably disposed in the chassis rail 122 having a first length S1. Therefore, when the handle 24 is rotated, the connecting rod 26 is driven to move along a direction of the chassis rail 122 (for example, the first direction D1 or the second direction D2). In some embodiments, the connecting rod 26 has a second convex part 263, the second convex part 263 is at the second end of the connection body 261, and the second convex part 263 is slidably disposed in the chassis rail 122. In some embodiments, the second convex part 263 is at the second end of the connection body 261 and protrudes toward the assembling portion 12 to match with the chassis rail 122. For example, the second convex part 263 is a cylindrical convex structure, and the size of the second convex part 263 (for example, the diameter of the cylinder) is less than or equal to the size of the chassis rail 122. Therefore, the second convex part 263 is slidably disposed in the chassis rail 122 without being interfered by the chassis rail 122 due to the size confliction between the second convex part 263 and the chassis rail 122. Accordingly, when the handle 24 is rotated along the third direction D3, the connecting rod 26 is driven to move along the direction of the chassis rail 122 (for example, the first direction D1), and the second convex 263 of the connecting rod 26 is driven to move from the end of the chassis rail 122 adjacent to the handle 24 (for example, the rightmost side of the chassis rail 122 shown in FIG. 5A) to the other end of the chassis rail 122 away from the handle 24 (for example, the leftmost side of the chassis rail 122 shown in FIG. 5A) along the first direction D1. The assembling portion 12 is fixed to the bottom plate 10, and the first length S1 of the chassis rail 122 is less than the second length S2 of the base rail 206. Therefore, when the second convex part 263 of the connecting rod 26 is abutted against the end of the chassis rail 122 away from the handle 24, if the handle 24 is kept rotating along the third direction D3, then the holding seat 2 can have a moving distance S3 (shown in FIG. 5C, which will be described later) along the direction (opposite to the original moving direction of the connecting rod 26; for example, the second direction D2). Therefore, the electronic element 3 in the holding seat 2 may be moved toward the second direction D2, thereby allowing the electronic element 3 to be assembled or connected to the other elements (such as the connector and the board 18) more easily.

Figure 5B:
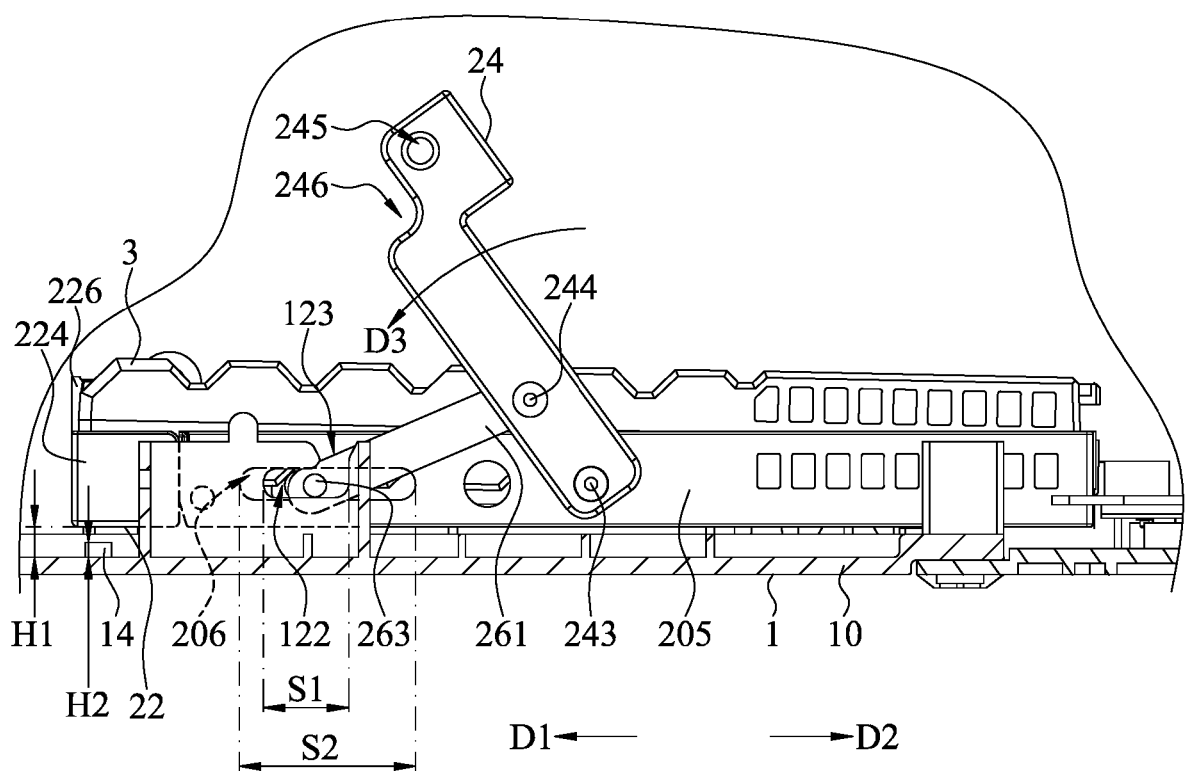
FIG. 5B illustrates a cross-sectional view of the chassis and the holding seat thereof according to some embodiments shown in FIG. 3C.
Figure 5C:
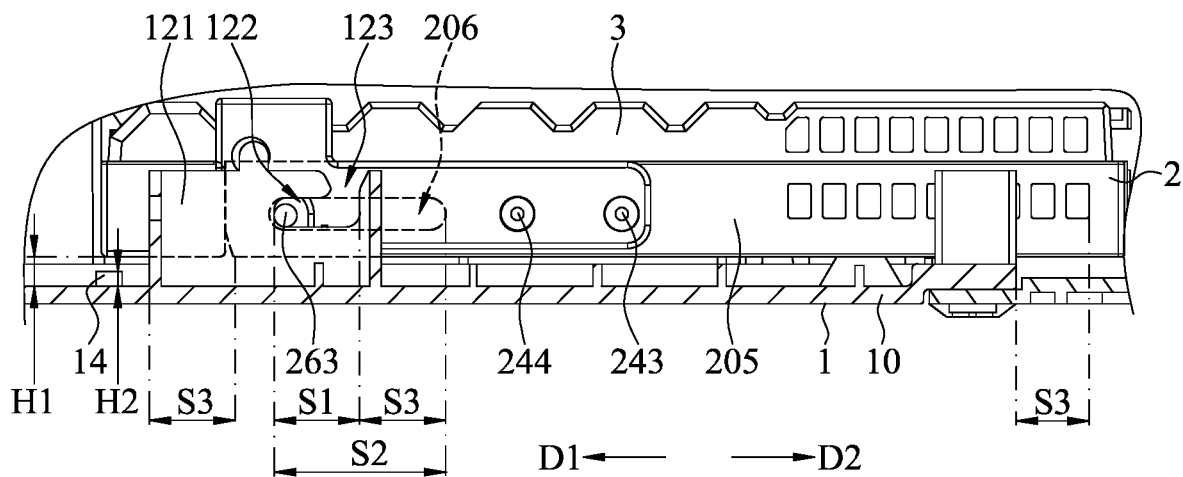
FIG. 5C illustrates a cross-sectional view of the chassis and the holding seat thereof according to some embodiments shown in FIG. 3E.

For example, please refer to FIG. 3A to FIG. 3F and FIG. 5A to FIG. 5C. FIG. 5B illustrates a cross-sectional view of the chassis 1 and the holding seat 2 thereof according to some embodiments shown in FIG. 3C, and FIG. 5C illustrates a cross-sectional view of the chassis 1 and the holding seat 2 thereof according to some embodiments shown in FIG. 3E. In FIG. 5A, the holding seat 2 shown in FIG. 3A and FIG. 3B is on the bottom plate 10 of the chassis 1. The second end of the connecting rod 26 (for example, the connection body 261) has a first convex part 262 and a second convex part 263 (as shown in FIG. 3A). The first convex part 262 is slidably disposed in the base rail 206 having a first length S1, the second convex part 263 is slidably disposed in the chassis rail 122 having a second length S2, and the first length S1 is less than the second length S2. Subsequently, the handle 24 is rotated with respect to the holding seat 2 (for example, along the third direction D3) as shown in FIG. 5B, and the connecting rod 26 is driven by the handle 24 to move. Therefore, the first convex part 262 and the second convex part 263 of the connecting rod 26 are driven to move toward the same direction (for example, the first direction D1) at the same time until the second convex part 263 is firstly abutted against the end of the chassis rail 122 with a shorter rail length away from the handle 24 (for example, the leftmost side of the chassis rail 122 shown in FIG. 5B). Subsequently, the handle 24 is further rotated along the third direction D3. Therefore, since the second convex part 263 is abutted against the end of the chassis rail 122, the chassis rail 122 provides a reaction force in the direction opposite to the moving direction of the second convex part 263 (that is, a counter force toward the second direction D2) to the connecting rod 26. Moreover, since the first convex part 262 is not abutted against by the base rail 206 yet, when the connecting rod 26 is kept being subjected to the counter force, the connecting rod 26 gradually drives the holding seat 2 to move along the second direction D2. Last, as shown in FIG. 5C, the handle 24 is kept rotating till the holding seat 2 is covered by the handle 24, and the first convex part 262 as well as the second convex part 263 are then abutted against, at the same time and respectively, the ends of the base rail 206 and the chassis rail 122 away from the handle 24 (for example, the leftmost side in FIG. 5C). Hence, the holding seat 2 is driven to move toward the board 18 with a moving distance S3 (for example, the moving distance S3 may be the difference between the positions of the holding seat 2 in FIG. 5A and FIG. 5C). In FIG. 5A, according to some embodiments, the end of the base rail 206 at the initial position is flush with the end of the chassis rail 122; for example, the ends at the initial position are the ends adjacent to the handle 24; for instance, the ends of the rightmost side shown in FIG. 5A. Therefore, the moving distance S3 of the holding seat 2 equals to the difference between the first length S1 of the chassis rail 122 and the second length S2 of the base rail 206 (as shown in FIG. 5C).

Please refer to FIG. 2A and FIG. 4 at the same time. In some embodiments, the chassis 1 further comprises a chassis positioning portion 16. The chassis positioning portion 16 is disposed on the bottom plate 10. The holding seat 2 (for example, the first base 20) further comprises a base positioning portion 202. The base positioning portion 202 corresponds to the chassis positioning portion 16, so that the chassis positioning portion 16 is slidably disposed on the base positioning portion 202. Therefore, through the arrangement of the chassis positioning portion 16 and the base positioning portion 202, the holding seat 2 can be positioned to the chassis 1 more easily, thereby allowing the holding seat 2 to be assembled (or even positioned) to the chassis 1 more quickly. For example, the base positioning portion 202 may be any concave structure, the chassis positioning portion 16 may be any convex structure, and the chassis positioning portion 16 matches with the base positioning portion 202. In some embodiments, the configurations of the base positioning portion 202 and the chassis positioning portion 16 may be exchanged; that is, the base positioning portion 202 may be any convex structure, and the chassis positioning portion 16 may be any concave structure. The concave structure may be a slot, a concave aperture/hole or combinations thereof, and the concave structure may be defined through the base positioning portion 202 or defined through the chassis positioning portion 16 or not; and the convex structure may be a ridge with any shape. For example, in FIG. 2A and FIG. 4, the base positioning portion 202 is a gourd-shaped through hole and has a top portion and bottom portion, and the bottom portion is wider than the top portion; the chassis positioning portion 16 is a sector-shaped protrusion. Therefore, by mating the chassis positioning portion 16 with the bottom portion of the gourd-shaped through hole, the base positioning portion 202 can be positioned by the chassis positioning portion 16 easily, so that the holding seat 2 can be positioned with the chassis 1 more easily and quickly, thereby reducing the positioning and assembling time for the holding seat 2. In addition, after the holding seat 2 is driven to move toward the board 18 by the moving distance S3 (for example, move rightward along the second direction D2), the chassis positioning portion 16 is fixed to the top portion of the gourd-shaped through hole, so that the holding seat 2 can be fixed to a specific position properly, thereby reducing the shaking of the holding seat 2.

In FIG. 5A, according to some embodiments, the bottom plate 10 of the chassis 1 further comprises one or more platforms. Each of the platforms corresponds to the holding seat 2 (for example, the first base 20) and is on the bottom plate 10, and the distance between the holding seat 2 (for example, the first base 20) and the bottom plate 10 is the first height H1. In FIG. 5A, according to some embodiments, the chassis 1 further comprises one or more ribs 14. The rib 14 corresponds to the second base 22, and the distance between a part of the second base 22 (or the entire second base 22) and the bottom plate 10 is the second height H2. The second height H2 is less than the first height H1. In some embodiments, the rib 14 is a platform having an inclined plane or a horizontal plane. Therefore, when the second base 22 is rotated away from the plane of the first base 20, the second base 22 can be supported by the rib 14 to be located at a certain height (for example, the second height H2). Hence, the second base 22 can be rotated back to the same height of the first base 20 (for example, the first height H1). In other words, through the arrangement of the rib 14, the falling angle θ between the second base 22 and the first base 20 can be quickly recovered to 0° (that is, in this embodiment, the second base 22 and the first base 20 can be arranged at the same horizontal plane).

In FIG. 4 and FIG. 5A, according to some embodiments, the assembling portion 12 of the chassis 1 further has one or more chassis fixing parts 124. The handle 24 of the holding seat 2 further has one or more third fixing parts 245. The chassis fixing part 124 corresponds to the third fixing part 245, so that the handle 24 is fixed to the chassis 1 when the handle 24 is rotated to cover the holding seat 2. Therefore, through the arrangement of the third fixing part 245 and the chassis fixing part 124, the holding seat 2 can be fixed to the chassis 1 more stably, thereby preventing the handle 24 from detaching off owing to impacts by external forces. Hence, the electronic element 3 received in the holding seat 2 is also prevented from detaching off. For example, the third fixing part 245 may be any concave structure, the chassis fixing part 124 may be any convex structure, and the chassis fixing part 124 matches with the third fixing part 245. In some embodiments, the configurations of the chassis fixing part 124 and the third fixing part 245 may be exchanged; that is, the third fixing part 245 may be any convex structure, and the chassis fixing part 124 may be any concave structure. The concave structure may be a slot, a concave aperture/hole or combinations thereof, and the concave structure may be defined through the third fixing part 245 or defined through the chassis fixing part 124 or not; and the convex structure may be a ridge with any shape.

In FIG. 3A, according to some embodiments, the handle 24 of the holding seat 2 further has one or more notches 246. The notch 246 is disposed on the handle body 241 and corresponds to the corresponding one of the base rails 206 and/or the corresponding one of the chassis rails 122. Hence, even though the handle 24 is rotated to cover the holding seat 2, the relative movement between the connecting rod 26 and the chassis rail 122 is not interfered by the handle body 241. For example, in FIG. 3A, the handle 24 has two notches 246. Each of the notches 246 is disposed on the end of the handle body 241 away from the holding seat 2. The distance between the notch 246 and the second fixing part 244 matches with the distance between the second convex part 263 and the second fixing part 244. Therefore, when the handle 24 is rotated to cover the holding seat 2, the relative movement between the second convex part 263 and the chassis rail 122 can be prevented from being interfered by the handle body 241.

From above, in some embodiments, the connecting rod of the holding seat is slidably disposed in the base rail. Therefore, the rotation of the handle of the holding seat can be achieved more conveniently, thereby allowing the electronic element to be fixed in the holding seat. In some embodiments, the connecting rod of the holding seat is further slidably disposed in the chassis rail, and the length of the chassis rail (the first length) is less than the length of the base rail (the second length). Hence, within a limited assembling space, the holding seat can have the moving distance in a direction different from the rotation direction of the handle easily by continuously rotating the handle to drive the connecting rod to abut against an end of the chassis rail firstly. Therefore, the electronic element (which is received in the holding seat) can be moved effectively with reduced efforts, thereby allowing the electronic element to be assembled and disassembled to the other element on the chassis quickly.

Although the present disclosure is disclosed in the foregoing embodiments as above, it is not intended to limit the present disclosure. Any person who is familiar with the relevant art can make some changes and modifications without departing from the spirit and scope of the present disclosure. Therefore, the scope of the present disclosure shall be subject to the definition of the scope of patent application attached to the specification.

What is claimed is:

1. A chassis comprising:
a bottom plate having a chassis rail; and
a holding seat having:
- a first base having a base rail;
- a handle pivotally connected to the first base; and
- a connecting rod disposed on an outer surface of the first base, in between the base rail and the chassis rail, and having a first end and a second end, wherein the first end is pivotally connected to the handle, and the second end is slidably disposed in the base rail and the chassis rail; and
- a second base pivotally connected to the first base and selectively driven by the handle to rotate toward the first base or away from the first base.

2. The chassis according to claim 1, wherein the chassis rail has a first length, the base rail has a second length, and the first length is less than the second length.

3. The chassis according to claim 1, wherein the second end of the connecting rod has a first convex part and a second convex part, the first convex part is slidably disposed in the base rail, and the second convex part is slidably disposed in the chassis rail.

4. The chassis according to claim 1, further comprising a chassis positioning portion on the bottom plate, wherein the first base further comprises a base positioning portion corresponding to the chassis positioning portion, so that the chassis positioning portion is slidably disposed on the base positioning portion.

5. The chassis according to claim 1, wherein the first base comprises a first shaft hole and a base shaft element, and the second base has a second shaft hole; the base shaft element passes through the first shaft hole and the second shaft hole, so that the second base is pivotally connected to the first base.

6. The chassis according to claim 1, wherein the second base further comprises an extension part, and the first base further comprises a base fixing part; the extension part extends from the second base toward the first base, and the extension part corresponds to the base fixing part to detachably receive the extension part in the base fixing part.

7. The chassis according to claim 6, wherein the first base further comprises an elastic element between the extension part and the first base.

8. The chassis according to claim 6, wherein the second end of the connecting rod has a first convex part and a second convex part, the first convex part is slidably disposed in the base rail, and the second convex part is slidably disposed in the chassis rail; the second convex part is detachably connected to the extension part, so that the extension part is detachably received in the base fixing part.

9. The chassis according to claim 8, wherein the second base further comprises a guiding part, the guiding part is connected to the extension part, and the guiding part is adjacent to an end of the first base, so that the first convex part is detachably abutted against the extension part along the guiding part.

10. The chassis according to claim 1, wherein the second base has a buckling part, and the buckling part is at an end of the second base opposite to the first base.

11. The chassis according to claim 1, further comprising a rib corresponding to the second base and on the bottom plate, wherein a distance between the first base and the bottom plate is a first height, the rib has a second height, and the second height is less than or equal to the first height.

* * * * *